(12) United States Patent
Lotfi et al.

(10) Patent No.: US 10,256,818 B2
(45) Date of Patent: Apr. 9, 2019

(54) LEVEL SHIFTER

(71) Applicant: QUALINX B.V., Delft (NL)

(72) Inventors: Reza Lotfi, Delft (NL); Sayed Rasoul Hosseini Boldaji, Delft (NL)

(73) Assignee: QUALINX B.V., Delft (NL)

(*) Notice: Subject to any disclaimer, the term of this patent is extended or adjusted under 35 U.S.C. 154(b) by 0 days.

(21) Appl. No.: 15/549,998

(22) PCT Filed: Feb. 9, 2016

(86) PCT No.: PCT/NL2016/050092
§ 371 (c)(1),
(2) Date: Aug. 9, 2017

(87) PCT Pub. No.: WO2016/130000
PCT Pub. Date: Aug. 18, 2016

(65) Prior Publication Data
US 2018/0034464 A1    Feb. 1, 2018

(30) Foreign Application Priority Data
Feb. 12, 2015    (NL) .................................... 2014280

(51) Int. Cl.
*H03K 19/00* (2006.01)
*H03K 19/0185* (2006.01)
*H03K 5/08* (2006.01)

(52) U.S. Cl.
CPC .......... *H03K 19/0013* (2013.01); *H03K 5/08* (2013.01); *H03K 19/018521* (2013.01); *H03K 19/018528* (2013.01)

(58) Field of Classification Search
CPC ....... H03K 19/0013; H03K 19/018528; H03K 5/08
(Continued)

(56) References Cited

U.S. PATENT DOCUMENTS 5,202,594 A    4/1993    Chang
5,341,047 A    4/1994    Rosenthal
(Continued)

OTHER PUBLICATIONS

International Search Report for International Application No. PCT/NL2016/050092 filed on Feb. 9, 2016 in the name of Technische Universiteit Delft. dated Jul. 18, 2016. 4 pages.
(Continued)

*Primary Examiner* — Thomas Skibinski
(74) *Attorney, Agent, or Firm* — Steinfl + Bruno LLP

(57) ABSTRACT

A level shifter (100) is presented comprising an input branch (102) and an output branch (104). The input branch comprises a first switch (130), a voltage clamping unit (120) and a controllable current source (110) in series. The output branch (104) comprises a second switch (140) and a third switch (150) in series, the second switch (140) and third switch (150) having opposite polarities. An output (OUT, 160) is provided between the second and the third switch (140, 150). The current source (110) is controlled by an input signal (IN) and the output signal (OUT). The first switch (130) is controlled by the input signal (IN). Switching control terminals (122, 124) of the second and the third switch are connected on either side of the clamping unit (120). This reduces voltage swing of switching control units, thus resulting in fast switching, less power consumption and wider voltage ranges. The input branch (102) draws a current only during level transitions, enabling fast switching and power saving in steady state of the level shifter (100).

15 Claims, 3 Drawing Sheets

(58) Field of Classification Search
USPC .................................................. 327/319, 333
See application file for complete search history.

(56) References Cited

U.S. PATENT DOCUMENTS

| | | | |
|---|---|---|---|
| 5,510,731 A * | 4/1996 | Dingwall | H03K 3/356017 |
| | | | 326/63 |
| 5,912,577 A | 1/1999 | Takagi | |
| 7,474,138 B2 | 1/2009 | Tsuchi et al. | |
| 7,511,553 B2 | 3/2009 | Nuebling | |
| 2007/0188193 A1 * | 8/2007 | Narwal | H03K 19/018528 |
| | | | 326/80 |
| 2009/0315610 A1 * | 12/2009 | Han | G09G 3/3696 |
| | | | 327/333 |
| 2010/0301818 A1 * | 12/2010 | Kim | H03K 3/35613 |
| | | | 323/282 |

OTHER PUBLICATIONS

International Written Opinion for International Application No. PCT/NL2016/050092 filed on Feb. 9, 2016 in the name of Technische Universiteit Delft. dated Jul. 18, 2016. 8 pages.

\* cited by examiner

LEVEL SHIFTER

CROSS REFERENCE TO RELATED APPLICATIONS

The present application is the U.S. national stage of International Patent Application PCT/NL2016/050092 filed internationally on Feb. 9, 2016, which, in turn, claims priority to Dutch (NL) Patent Application No. 2014280 filed on Feb. 12, 2015.

TECHNICAL FIELD

The various aspects relate to a level shifter circuit. More in particular, the various aspects relate to a level shifter circuit for integration in an integrated circuit.

BACKGROUND

Level shifter circuits are used for transmitting a signal from a first region of an integrated circuit having a first supply voltage to a second region of an integrated circuit having a second supply voltage. As many devices in which integrated circuits are used are powered by batteries, power consumption of such devices and therefore of such integrated circuits is a parameter that is very important. Furthermore, as applications run on such devices are more and more demanding, also speed is an important parameter.

U.S. Pat. No. 7,511,553 relates to a level shifter. An input stage comprises a current mirror for discharging switches at an output stage of the level shifter.

U.S. Pat. No. 7,474,138 relates to a level shifter. The circuit comprises two complementary input stages. Each input stage comprises a current source controlled by an input and an output signal. The input stages control two cross-coupled inverters, each input stage controls another inverter. One of the control effects is the current provided by the current sources being copied to the output stages.

SUMMARY

It is preferred to provide an improved level shifter, with respect to speed, range of voltage levels being converted and/or power consumption performance.

A first aspect provides a level shifter comprising an input branch arranged to be provided between a first supply node and a second supply node having a first voltage level between them, the first supply node having a higher potential than the second supply node. The input branch comprising in series a current source having a first control input for receiving a first input signal and a second control input for receiving an output signal of the level shifter, a first voltage clamping unit comprising a first clamping terminal and a second clamping terminal for providing a first clamping voltage between the first clamping terminal and the second clamping terminal; and a first switch having a third control input for receiving a second input signal. The level shifter further comprising an output branch provided in parallel to the input branch, the output branch comprising in series a second switch having a first polarity comprising a first output control input connected to the first clamping terminal and a third switch having a second polarity comprising a second output control input connected to the second clamping terminal. An output terminal is provided between the second switch and the third switch for providing the output signal.

By providing the voltage clamping unit between switching control terminals of the second switch and the third switch, voltage swing of nodes during switching is reduced. This results in faster switching. The current source aids in faster switching by providing a current through the voltage clamping unit and by driving a current for controlling the switching of the second switch and third switch.

An embodiment of the first aspect comprises a second voltage clamping unit for providing a second clamping voltage, such that the first voltage clamping unit and the second voltage clamping unit are provided between the first output control input and the second output control input.

An advantage of this embodiment is that voltage swing between the switching control terminals of the second switch and the third switch is even further reduced. This is particularly advantageous in case differences in supply voltages at input and output are larger.

Another embodiment of the first aspect comprises a fourth switch provided in parallel to the second voltage clamping unit, the switch comprising a third control input for receiving a third control signal.

This embodiment provides flexibility in the clamping voltage provided. Should the supply voltage at the input, at the output or at both ends vary during operation, or for the cases where the level shifter is to be used for a wide range of input or output voltage levels, the characteristics of the level shifter may be adjusted accordingly to ensure operation in an optimal configuration.

A further embodiment of the first aspect comprises a fifth switch provided in parallel to the first clamping unit and the first switch, the fifth switch having a fourth control input for receiving the second control signal.

The fifth switch aids in faster switching of the second switch, thus resulting in faster operation of the circuit.

Yet another embodiment of the first aspect comprises an inverter circuit having an inverter input and an inverter output, the inverter being arranged to be provided between a third supply node and the second supply node having a second supply voltage between them, the potential of the third supply node being lower than potential of the first supply node and higher than the potential of the second supply node, wherein the inverter circuit is connected to the level shifter such that the first control input is connected to the inverter output and the third control input is connected to the inverter input.

The inverter provides control signals to the level shifter circuit facilitating simple design of the actual level shifter.

A second aspect comprises a first circuit region comprising a first circuit arranged to operate between the second supply voltage and the third supply voltage a second circuit region comprising a second circuit arranged to operate between the second supply voltage and the first supply voltage; and the level shifter according to the yet other embodiment of the first aspect, the inverter input being connected to a first circuit provided in the first circuit region and the output terminal being connected to a second circuit provided in the second circuit region.

A third aspect provides a computer readable medium comprising an electronic representation of a circuit, the circuit comprising the level shifter according to the first aspect.

BRIEF DESCRIPTION OF THE DRAWINGS

The various aspects and embodiments thereof will now be discussed in conjunction with Figures. In the Figures.

DETAILED DESCRIPTION

Figure 1:
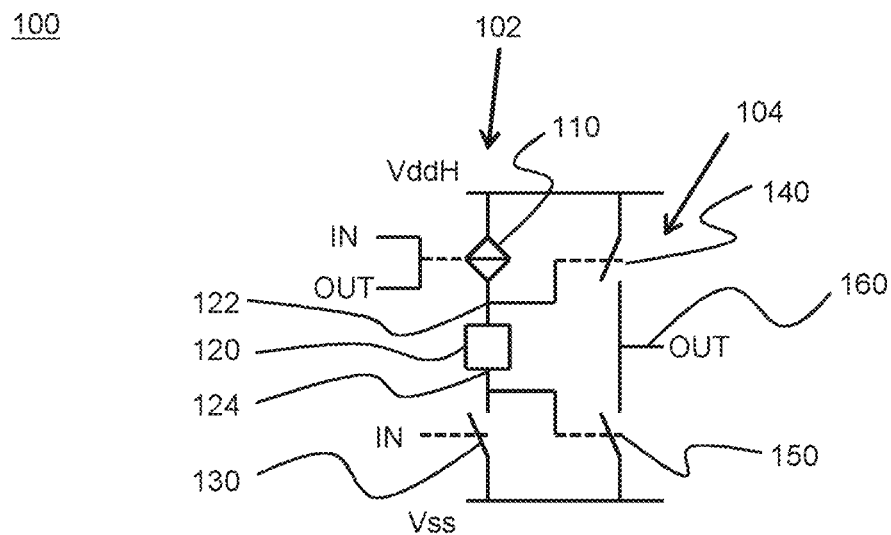
FIG. 1: shows a schematic representation of a level shifter circuit.

FIG. 1 shows a schematic representation of a level shifter circuit 100. The level shifter circuit comprises an input branch 102 and an output branch 104. The input branch 102 and the output branch 104 are provided parallel to one another between a first supply node VddH having a first voltage level and a second supply node Vss having a second voltage level. The second voltage level is preferably ground level or grounded.

The input branch 102 comprises a controllable current source 110, a voltage clamping unit 120 having a first terminal 122 and a second terminal 124 and a first switch 130. The output branch 104 comprises a second switch 140 and a third switch 150 provided in series. An output terminal 160 is provided to the second branch 104 between the second switch 140 and the third switch 150 for providing an output signal.

The current source 110 is controlled by the output signal and by an input signal. The output signal and the input signal control the current of the controllable current source 110 such that if both signals have opposite logic levels, no current is provided by the current source.

The first switch 130 is controlled by the input signal. In this embodiment, the first switch 130 is controlled such that the switch is closed if the input signal has a logic high level and opened if the input signal has a logic low level. In another embodiment, this is the other way around.

Between the controllable current source 110 and the first switch 130, the voltage clamping unit 120 is provided in this embodiment. The voltage clamping unit 120 is arranged to have a pre-determined voltage over it, substantially independent from the current through the device. Such devices may be provided by means of a Zener diode, but other physical circuit components may be used as well.

The second switch 140 and the third switch 150 are of opposite polarity types. This means that if both switches are controlled by one and the same a signal having a logic low level, one switch is open and the other switch is closed—and the other way around. In this embodiment, the second switch 140 is closed if the control signal provided to the second switch 140 is low and the third switch 150 is open if the control signal provided to the third switch 150 is low. The control input of the second switch 140 is connected to the first terminal 122 of the voltage clamping unit 120 and the control input of the third switch 160 is connected to the second terminal 124 of the voltage clamping unit 140. The voltage over the voltage clamping unit 120 is determined such that, in steady state, a voltage level between the second supply node and the first terminal 122 and a voltage level between the second supply node and the second terminal 124 constitute the same logic value.

Figure 2:
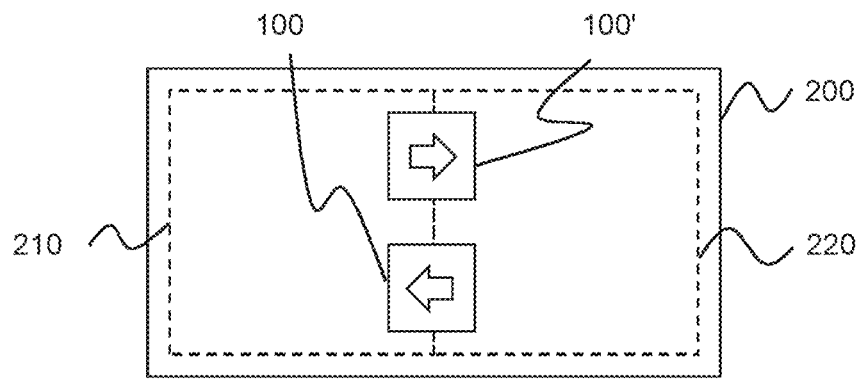
FIG. 2: shows a schematic representation of an integrated circuit.

FIG. 2 shows an integrated circuit 200 comprising a first region 210 employing a first supply voltage and a second region 220 employing a second supply voltage. The first supply voltage is lower than the second supply voltage. For communication between the first region 210 and the second region 220, a first level shifter 100 and a second level shifter 100' are employed. The first level shifter 100 communicates signals from the first region 210 to the second region 220 and the second level shifter 100' communicates signals from the second region 220 to the first region 210. So the first level shifter 100 shifts the level of a communicated signal from, for example, 0.9 Volts to 1.8 Volts and the second level shifter 100' shifts the level of a communicated signal from 1.8 Volts to 0.9 Volts. Other voltage levels may be envisaged as well. The first region 210 and the second region 220 may share a common ground level.

The first level shifter 100 may be embodied as depicted by FIG. 1, for transforming a signal from the first region 210—lower voltage—to a signal suitable for handling by the second region 220—higher voltage. The various aspects and embodiments thereof discussed here relate to the first level shifter 100 and equivalent devices.

Figure 3:
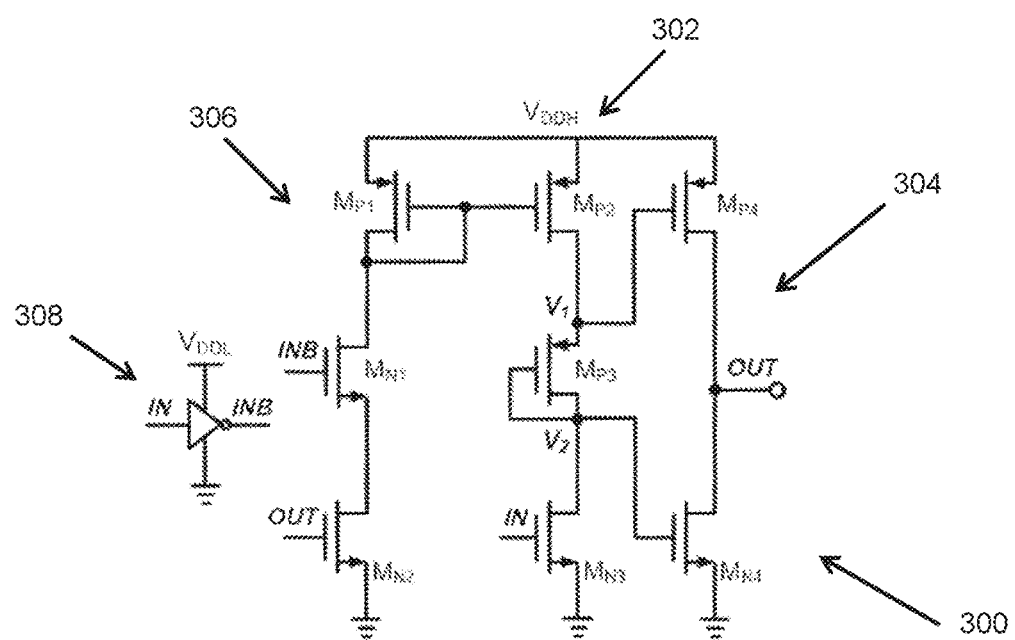
FIG. 3: shows a circuit diagram of a level shifter.

FIG. 3 shows a level shifter 300 as an embodiment of the first aspect. The level shifter 300 comprises an output branch 304, an input branch 302 and a control branch 306. The input branch 302 comprises an NMOS transistor MN3 as a first switch, a PMOS transistor MP3 with gate and drain cut short, acting as a voltage clamping device, and a PMOS transistor MP2 acting as a controllable current source in a current mirror configuration. The gate of the NMOS transistor MN3 is provided as a first input terminal for receiving an input signal.

The output branch 304 comprises a PMOS transistor MP4 connected in series with an NMOS transistor MN4. Both the PMOS transistor MP4 and the NMOS transistor MN4 mainly act as complementary switches. The gate of the PMOS transistor MP4 is connected to the source of the PMOS transistor MP3 and the gate of the NMOS transistor MN4 is connected to the drain and the gate of the PMOS transistor MP3.

The gate of the PMOS transistor MP2 acting as a controllable current source is connected to the gate and drain of a PMOS transistor MP1, constituting a current mirror. The current through the current mirror is controlled by NMOS transistor MN1 and NMOS transistor MN2, both connected in series with one another and with the PMOS transistor MP1 in the control branch 306. The current provided by the current mirror may thus be switched on and off by the NMOS transistor MN1 and the NMOS transistor MN2.

The gate of the NMOS transistor MN1 is provided as a second input terminal, fed with the compliment of the input signal. So if the first input is provided with a high signal, the second input is provided with a low signal. Inversion of the input signal may be established by means of the inverter circuit 308. The inverter circuit 308 may be provided together with the level shifter 300 as one circuit or as a separate circuit.

It is noted the input branch 302, the output branch 304 and the control branch 306 are provided between two supply nodes between which a higher supply voltage is applied. The inverter circuit 308 is provided between two other supply nodes between which a lower supply voltage is applied. Hence, the input signal is provided in the lower voltage domain.

In steady state, the output signal will have the same level as the input signal. The functionality of the level shifter 300 will now firstly be described in a case where the input signal transits from high to low. Both the NMOS transistor MN1 and the NMOS transistor MN2 are provided with a high signal. The output signal provided to the NMOS transistor MN2 is still high due to circuit delay. This closes the control branch 306 and allows a current through the PMOS transistor MP1. This current is mirrored in the input branch 302. As NMOS transistor MN3 is turned off due to the low signal provided at the gate, the mirrored current flowing through the PMOS transistor MP2 and the PMOS transistor MP3 will quickly pull up the gates of the PMOS transistor MP4 and the NMOS transistor MN4.

The current forced through the PMOS transistor MNP2 hence provides a quick charging—or discharging—of the gates of the PMOS transistor MP4 and the NMOS transistor MN4. The diode connected PMOS transistor MP3 increases voltage of the gate of the PMOS transistor MP4. This results in faster switching off of the PMOS transistor MP4. Also this enhances the speed of the level shifter 300 and reduces power consumption.

Moving to steady state, with the gates of the PMOS transistor MP4 and the NMOS transistor MN4 pulled up, the output is pulled to ground level and becomes low. Thus the signal on NMOS transistor MN2 becomes low and the current in the control branch 306 is switched off. This, in turn, switches off the current in the input branch 302. The output branch 304 is provided as a CMOS inverter, for which reason no current flows through the output branch 304 in steady state.

In a transition from low to high, the signal on the gate of the NMOS transistor MN1 is low and the NMOS transistor MN1 is switched off. Hence, no current flows through the control branch 306—nor through the PMOS transistor MP2. The NMOS transistor MN3 is switched on, resulting in pulling down of the gates of the PMOS transistor MP4 and the NMOS transistor MN4. This switches off NMOS transistor MN4 and switches on PMOS transistor MP4. As a result, the output is pulled up to the level of VDDH.

Due to the diode connected PMOS transistor MP3, the voltage swing at the drain terminal of the PMOS transistor MP3—and the gate terminal of the NMOS transistor MN4—is reduced. This results in the NMOS transistor MN4 being switch off faster than without the PMOS transistor MP3.

Figure 4:
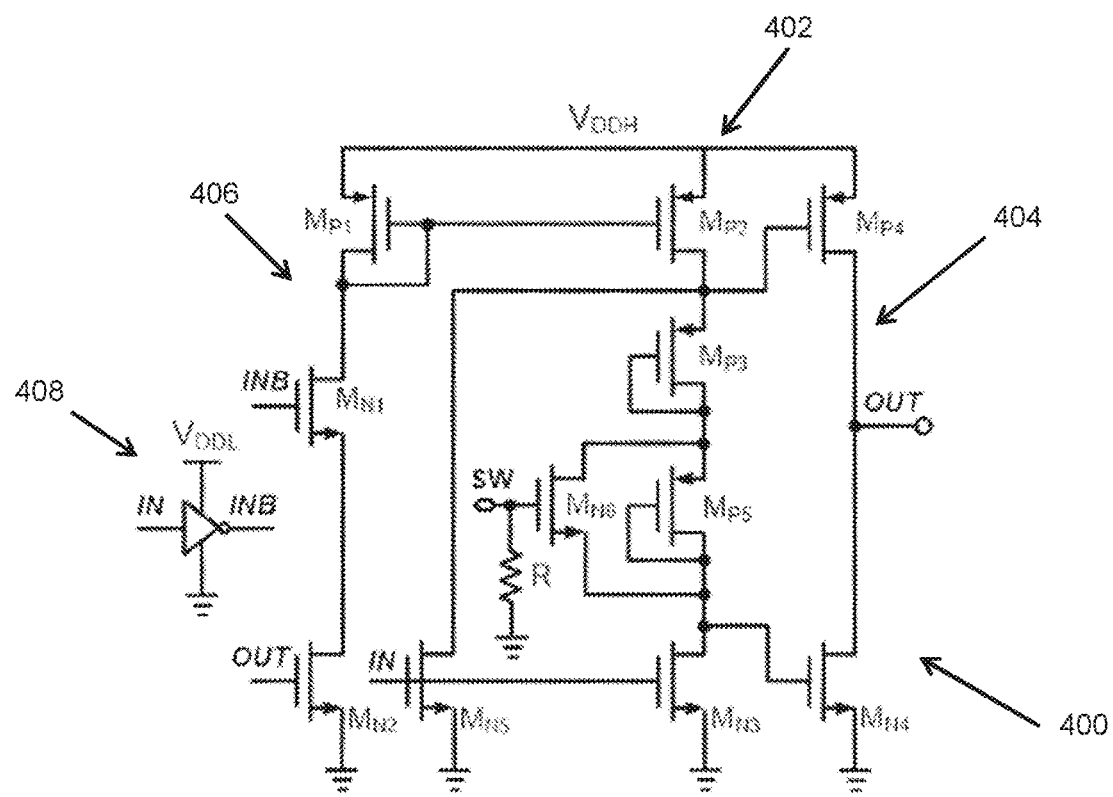
FIG. 4: shows a circuit diagram of a further level shifter.

FIG. 4 shows another level shifter 400 as another embodiment of first aspect. The level shifter 400 comprises an output branch 404, an input branch 402 and a control branch 406. The other level shifter 400 may be provided together with an inverter circuit 408. Compared to the level shifter 300 depicted by FIG. 3, the other level shifter 400 comprises additional components.

Firstly, an additional voltage clamping device has been provided by means of the PMOS transistor MP5, connected in series with the PMOS transistor MP3. By providing the additional voltage clamping device, voltage swings at the gate of the NMOS transistor MN4 with the input moving from high to low and voltage swings at the gate of PMOS transistor MP4 with the input moving from low to high are reduced. This, in turn, results in faster switching and less power consumption during switching.

In parallel to the PMOS transistor MP5, an optional NMOS transistor MN6 is provided. The gate of the NMOS transistor MN6 is provided with a control terminal for providing a control signal. Hence, the total clamping voltage provided by the PMOS transistor MP3 and the PMOS transistor MP5 is selectable, making the level shifter 400 flexible with respect to the lower and higher supply voltages.

The level shifter 400 is also provided with an NMOS transistor MN5 of which the source is connected to ground. The gate of the NMOS transistor MN5 is connected to the gate of the NMOS transistor MN3, and may thus be provided with the input signal. The drain of the NMOS transistor MN5 is connected to the gate of the PMOS transistor MP4.

The NMOS transistor MN5 is switched on at a change of the input signal from low to high. This results in a faster pull down of the gate of the PMOS transistor MP4. This results in a faster transition of the output to VDDH. The NMOS transistor MN5 may be provided together with the PMOS transistor MP5 as additional clamping device or independently from the PMOS transistor MP5. Likewise, the PMOS transistor MP5 may be provided together with the NMOS transistor MN5 or independently from the NMOS transistor MN5.

The transistors as described in the embodiments are enhancement type MOS transistors, unless specified otherwise. The transistors are specified in two polarities, NMOS and PMOS, having their specific characteristics. Unless specifically specified, the circuits may be embodied using other polarity types than described in conjunction with the embodiments. Transistors performing a functionality of switching may be replaced by other switching devices as well. That could be other types of transistors or yet another type of switches. Likewise, also analogue functions provided by transistors depicted by FIG. 3 or FIG. 4 as having one polarity may also be embodied having another polarity, like the current mirror. This may be embodied using NMOS transistors connected mirrored, to the ground level.

Figure 5:
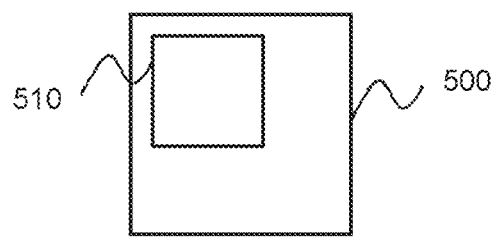
FIG. 5: shows a computer readable medium comprising an electronic representation of a library cell representing a level shifter.

The various embodiments of the first aspect discussed above are preferably embedded in an integrated semiconductor circuit. Referring to FIG. 5, for designing such circuit, a level shifter may be provided in a library cell 510, either with or without a coupled inverter circuit. The library cell 510 is a digitised or electronic representation of a physically implantable level shifter. The electronic representation may be provided on a computer readable medium 500, either transitional or non-transitional. The electronic representation may be read by a computer for fitting the library cell into a larger design of an integrated circuit.

In summary, a level shifter is presented comprising an input branch and an output branch. The input branch comprises a first switch, a voltage clamping unit and a controllable current source in series. The output branch comprises a second switch and a third switch in series, the second switch and third switch having opposite polarities. An output is provided between the second and the third switch. The current source is controlled by an input signal and the output signal. The first switch is controlled by the input signal. Switching control terminals of the second and the third switch are connected on either side of the clamping unit. This reduces voltage swing of switching control units, thus resulting in fast switching. The input branch draws a current only during level transitions, enabling fast switching and power saving in steady state of the level shifter.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

In the description above, it will be understood that when an element such as layer, region or substrate or components of a system are referred to as being "on", "onto" or "connected to" another element, the element is either directly on or connected to the other element, or intervening elements may also be present.

Furthermore, the invention may also be embodied with less components than provided in the embodiments described here, wherein one component carries out multiple functions. Just as well may the invention be embodied using more elements than depicted in the Figures, wherein functions carried out by one component in the embodiment provided are distributed over multiple components.

A person skilled in the art will readily appreciate that various parameters disclosed in the description may be modified and that various embodiments disclosed and/or claimed may be combined without departing from the scope of the invention.

It is stipulated that the reference signs in the claims do not limit the scope of the claims, but are merely inserted to enhance the legibility of the claims.

The invention claimed is:

1. A level shifter comprising an input branch arranged to be provided between a first supply node and a second supply node having a first voltage level between them, the first supply node having a higher potential than the second supply node and the input branch comprising in series:
    a current source having a first control input for receiving a first input signal and a second control input for receiving an output signal of the level shifter;
    a first voltage clamping unit comprising a first clamping terminal and a second clamping terminal for providing a first clamping voltage between the first clamping terminal and the second clamping terminal; and
    a first switch having a third control input for receiving a second input signal; and the level shifter further comprising an output branch provided in parallel to the input branch, the output branch comprising in series:
    a second switch having a first polarity comprising a first output control input connected to the first clamping terminal; and
    a third switch having a second polarity comprising a second output control input connected to the second clamping terminal;
    wherein an output terminal is provided between the second switch and the third switch for providing the output signal, and
    wherein said current source is configured to provide a current through said voltage clamping unit and to drive a current that controls switching for the second switch and the third switch.

2. The level shifter according to claim 1, further comprising a second voltage clamping unit for providing a second clamping voltage, such that the first voltage clamping unit and the second voltage clamping unit are provided between the first output control input and the second output control input.

3. The level shifter according to claim 2, further comprising a fourth switch provided in parallel to the second voltage clamping unit, the fourth switch comprising a third control input for receiving a third control signal.

4. The level shifter according to claim 1, further comprising a fifth switch provided in parallel to the first clamping unit and the first switch, the fifth switch having a fourth control input for receiving the second control signal.

5. The level shifter according to claim 4, wherein the fifth switch and the first switch have the same polarity.

6. The level shifter according to claim 1, wherein the first voltage clamping unit comprises a MOS transistor having gate and drain connected.

7. The level shifter according to claim 1, further comprising a current control branch comprising connected in series:
    a first transistor having gate and drain connected;
    a sixth switch controllable by the output signal; and
    a seventh switch controllable by the first input signal,
    wherein the current source comprises a second transistor having the same polarity as the first transistor and the gate of the second transistor is connected to the gate of the first transistor.

8. The level shifter according to claim 7 wherein the first transistor is of the first polarity and the sixth switch and the seventh switch are transistors of the second polarity.

9. The level shifter according to claim 8, wherein the first transistor is a PMOS transistor and the sixth switch and the seventh switch are NMOS transistors.

10. The level shifter according to claim 1, wherein the second switch is a PMOS transistor having the drain connected to the first supply node and the third switch is an NMOS transistor having the drain connected to the second supply node.

11. The level shifter according to claim 1, wherein:
    the first switch is an NMOS transistor having the drain connected to the second supply node and the source connected to the first clamping terminal;
    the second clamping terminal is connected to a first current terminal of the current source; and
    a second terminal of the current source is connected to the first supply node.

12. The level shifter according to claim 1, further comprising an inverter circuit having an inverter input and an inverter output, the inverter being arranged to be provided between a third supply node and the second supply voltage node having a second supply voltage between them, the potential of the third supply node being lower than potential of the first supply node and higher than the potential of the second supply node, wherein the inverter circuit is connected to the level shifter such that the first control input is connected to the inverter output and the third control input is connected to the inverter input.

13. A semiconductor integrated circuit comprising:
    a first circuit region comprising a first circuit arranged to operate at the second supply voltage,
    a second circuit region comprising a second circuit arranged to operate at the first supply voltage; and
    the level shifter according to claim 12, the inverter input being connected to the first circuit and the output terminal being connected to the second circuit.

14. The level shifter according to claim 1, wherein the second supply voltage is a ground level.

15. A non-transient computer-readable medium comprising an electronic representation of a circuit, the circuit comprising the level shifter according to claim 1.

* * * * *